(12) United States Patent
Liu

(10) Patent No.: US 6,303,437 B1
(45) Date of Patent: Oct. 16, 2001

(54) TRENCHED GATE SEMICONDUCTOR METHOD FOR LOW POWER APPLICATIONS

(75) Inventor: Yowjuang W. Liu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/632,536

(22) Filed: Aug. 4, 2000

Related U.S. Application Data

(62) Division of application No. 09/052,058, filed on Mar. 30, 1998.

(51) Int. Cl.[7] .................................................. H01L 21/336
(52) U.S. Cl. .......................... 438/257; 438/259; 438/268; 438/269; 438/270
(58) Field of Search .................................... 438/257, 259, 438/268, 269, 270

(56) References Cited

U.S. PATENT DOCUMENTS

| | | | |
|---|---|---|---|
| 4,979,004 | 12/1990 | Esquivel et al. ................... 357/23.5 |
| 4,990,979 | 2/1991 | Otto ................................... 357/23.5 |
| 5,016,067 | 5/1991 | Mori ................................... 357/23.4 |
| 5,278,438 | * 1/1994 | Kim et al. .......................... 257/316 |
| 5,378,655 | 1/1995 | Hutchings et al. ................. 437/203 |
| 5,427,963 | * 6/1995 | Richart et al. ...................... 437/41 |
| 5,506,431 | * 4/1996 | Thomas ........................... 368/185.15 |
| 5,547,889 | * 8/1996 | Kim ................................... 437/52 |
| 5,559,048 | * 9/1996 | Inoue ................................. 437/43 |
| 5,705,415 | 1/1998 | Orlowski et al. ..................... 437/43 |
| 5,770,878 | 6/1998 | Beasom ............................... 257/330 |
| 5,773,343 | 6/1998 | Lee et al. ........................... 438/259 |
| 5,883,399 | 3/1999 | Yin et al. ............................. 257/66 |
| 5,953,602 | * 9/1999 | Oh et al. ............................. 438/201 |
| 6,048,768 | * 4/2000 | Ding et al. .......................... 438/264 |
| 6,096,624 | * 8/2000 | Chen et al. ......................... 438/443 |
| 6,127,223 | * 10/2000 | Lin ...................................... 438/257 |
| 6,159,797 | * 12/2000 | Lee ..................................... 438/257 |
| 6,171,906 | * 1/2001 | Hsieh et al. ........................ 438/257 |
| 6,171,907 | * 1/2001 | Tuntasood .......................... 438/264 |
| 6,172,394 | * 1/2001 | Nakagava ........................... 257/315 |

* cited by examiner

*Primary Examiner*—Long Pham
*Assistant Examiner*—Ravindra B. Shukla

(57) ABSTRACT

A non-volatile semiconductor device structure and method for low power applications comprises a trenched floating gate and corner dopings and further includes a well junction region with a source region and a drain region therein, and includes a channel region, an inter-gate dielectric layer, and a control gate. The trenched floating gate is formed in a trench etched into the semiconductor substrate and has a top surface which is substantially planar with a top surface of the semiconductor substrate. The source and drain regions are laterally separated by the trench in which the trenched floating gate is formed and have a depth which is approximately less than the depth of the trench. The channel region is formed beneath a bottom surface of the trench and is doped to form a depletion type channel region. Corner dopings are diffusion regions formed adjacent to the source and drain regions of the semiconductor substrate and are immediately contiguous the upper vertical sides of the trench and the substrate surface.

5 Claims, 16 Drawing Sheets

TRENCHED GATE SEMICONDUCTOR METHOD FOR LOW POWER APPLICATIONS

RELATED APPLICATIONS

This is a divisional of co-pending application Ser. No. 09/052,058 filed on Mar. 30, 1998, which is incorporated by reference herein in its entirety.

The subject matter of this application is related to the subject of commonly assigned U.S. patent applications having the following serial numbers and titles: A Trenched Gate Metal Oxide Semiconductor Device and Method, and Ser. No. 09/052,051, "A Trenced Gate Non-Volatile Semiconductor Device and Method with Corner Doping and Sidewall Doping", all concurrently filed herewith.

FIELD OF THE INVENTION

The present invention relates generally to semiconductor devices and methods of manufacture, and more particularly, to semiconductor devices and methods of manufacture including a trenched gate.

BACKGROUND OF THE INVENTION

Conventional semiconductor non-volatile memories, such as read-only memories (ROMs), erasable-programmable ROMs (EPROMs), electrically erasable-programmable ROMs (EEPROMs), and flash EEPROMs are typically constructed using a double-poly structure. Referring now to FIG. 1, there is shown a cross-sectional view of the device structure of a conventional nonvolatile memory device 100 including a substrate 102 of a semiconductor crystal such as silicon. The device 100 also includes a channel region 104, a source region 106, a drain region 108, a floating gate dielectric laser 110, a floating gate electrode 112, an inter-gate dielectric layer 114, and a control gate electrode 116. The floating gate dielectric layer 110 isolates the floating gate electrode 112 from the underlying substrate 102 while the inter-gate dielectric layer 114 isolates the control gate electrode 116 from the floating gate electrode 112. As shown in FIG. 1, the floating gate dielectric layer 110, the floating gate electrode 112, the inter-gate dielectric layer 114, and the control gate electrode 116 are all disposed above the surface of substrate 102. The device structure of conventional non-volatile memory devices as shown in FIG. 1 is limited to the degree to which the active devices can be made smaller in order to increase device packing density and performance. Additionally, the stacked dual gate structure which is formed on the substrate surface is sensitive to process variations of overlaps between the floating gate and the source and drain junctions.

SUMMARY OF THE INVENTION

In accordance with the present invention, a non-volatile semiconductor device for low power applications is fabricated to include a trenched floating gate, a control gate and corner dopings. Embodiments employing the principles of the present invention provide low substrate current programming and an enhanced erase function for high speed operations. Additionally, the device structure of the present invention improves the topography, the scaleability, and the device packing density of the device. Furthermore, embodiments employing the principles of the present invention also minimize the sensitivity to process variations of overlaps between the control gate and the source and drain regions and improve isolation by reducing leakages along the corners of the trench in which the trenched floating gate is formed.

In one embodiment of the present invention, a semiconductor device for low power applications is fabricated on a semiconductor substrate to include a trenched floating gate and corner dopings. The device also includes a p-well junction region and a source and drain region which are formed in the p-well junction region. The trench in which the floating gate is formed partially extends into the p-well junction region and laterally separates the source and drain regions. The depth of the source and drain regions is approximately equal to or less than the depth of the trench. The corner dopings are formed in the semiconductor substrate just below the substrate surface. The corner dopings are immediately contiguous to the upper vertical sides of the trench in which the trenched floating gate is formed and immediately contiguous to the substrate surface.

In accordance with the present invention, a trenched floating gate semiconductor device with corner dopings for low power applications is fabricated by first forming a well junction in the silicon substrate. A trench is then etched in the silicon substrate and the substrate is implanted with dopant impurities to form a channel region beneath the trench. In a preferred embodiment, a depletion type channel region is formed to achieve a low threshold voltage. The depletion type channel region is formed by implanting dopant impurities of the same type as those used for the source and drain regions. A trench-to-gate insulating layer is deposited inside the trench followed by a layer of polysilicon to form the trenched floating gate. The polysilicon layer is planarized and an inter-gate dielectric layer is formed on a top surface of the trenched floating gate. A control gate is then fabricated on the inter-gate dielectric layer. After the control gate has been formed, the substrate is then implanted with dopant impurities to form the corner dopings. Finally, control gate spacers are formed at the vertical surfaces of the control gate, and source and drain regions are implanted into the substrate.

DESCRIPTION OF THE PREFERRED EMBODIMENT

Figure 1:
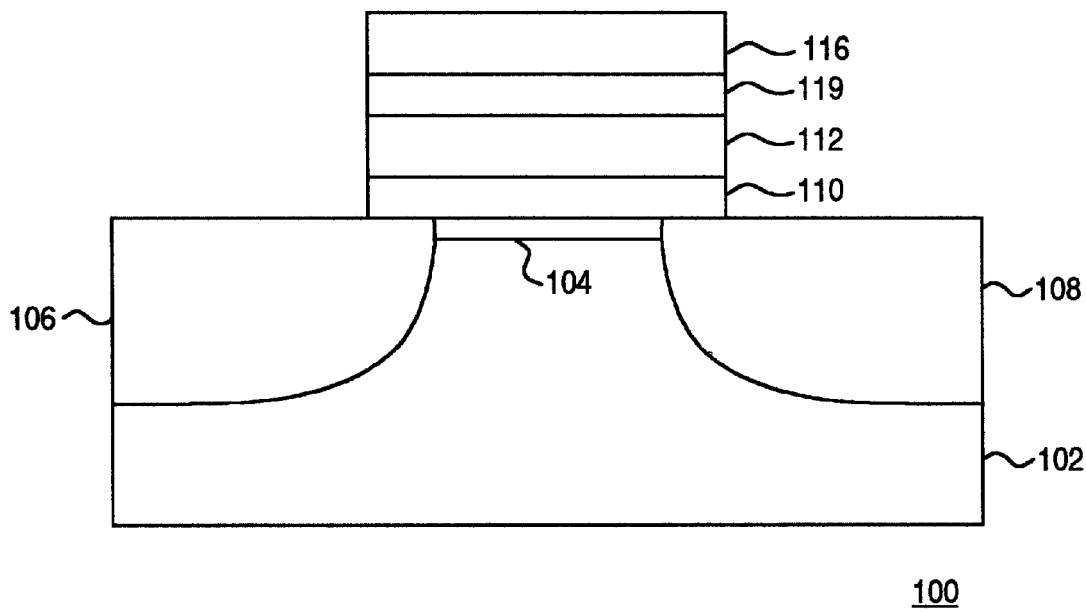
FIG. 1 is a cross-sectional view of a conventional non-volatile device.
Figure 2A:
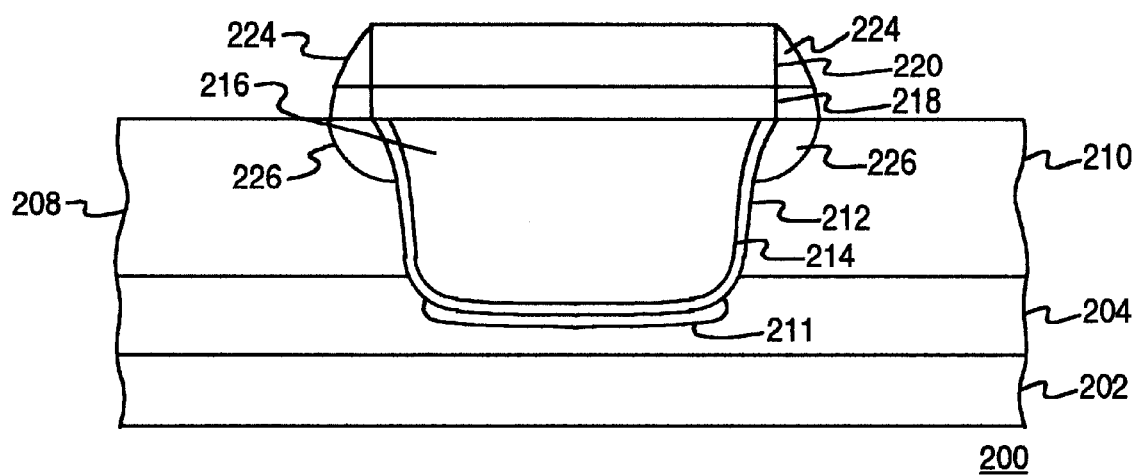
FIGS. 2A and 2B are cross-sectional views of a dual gate device embodying the principles of the present invention.

FIG. 2A is a cross-sectional view of a non-volatile device embodying the principles of the present invention. FIG. 2A shows a semiconductor structure 200 including a substrate 202 of a semiconductor crystal such as silicon, according to one embodiment of the present invention. The substrate 202 is preferably n-doped or provided with an n-well to a suitable threshold voltage level in accordance with conventional silicon semiconductor fabrication techniques. Semiconductor structure 200 also includes a well junction region 204, preferably p-type, formed in the semiconductor substrate 202. Structure 200 also includes a source region 208, a drain region 210, a channel region 211, a trench 212, a trench-to-gate insulating layer 214, a trenched floating gate electrode 216, an inter-gate insulating layer 218, a control gate electrode 220, control gate spacers 224, and corner dopings 226.

Figure 2B:
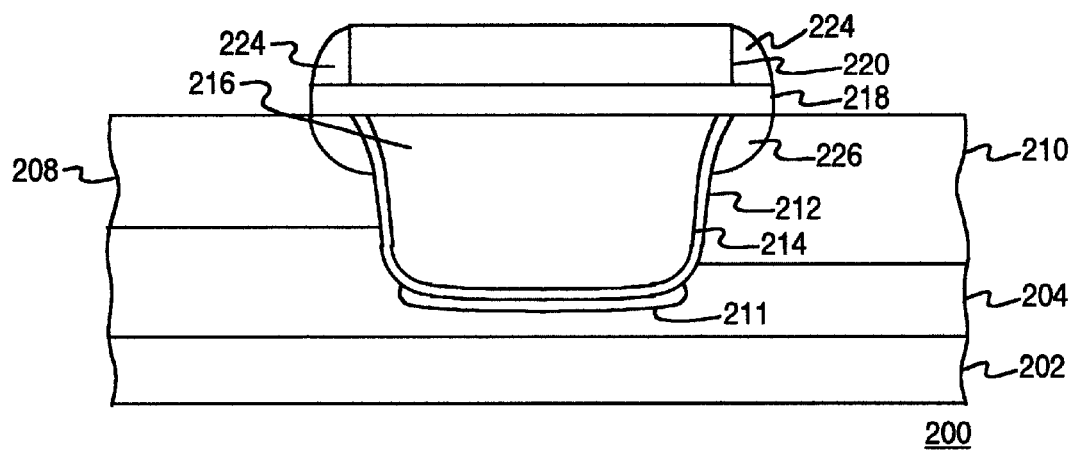

Source region 208 and drain region 210 are diffusion regions of semiconductor material that are doped with impurities that have a conductivity which is opposite to the conductivity of well junction region 204. For example, when well junction region 204 is p-doped, the opposite conductivity type for source region 208 and drain region 210 is n-type. Preferably source region 208 and drain region 210 are doped with "donor" or n-type impurities of phosphorous, arsenic or the like in conventional manner with a dose range of on the order of approximately $1E14$ cm$^{-2}$ to approximately $1E16$ cm$^{-2}$. Source region 208 and drain region 210 have a depth which is approximately less than the depth of trench 212. In one embodiment, the depths of source region 208 and drain region 210 may be asymmetrical with both depths still being approximately less than the depth of the trench as shown in FIG. 2B. Channel region 211 is an implanted region formed beneath the bottom surface of trench 212. In a preferred embodiment, channel region 211 is a depletion type channel region. In such embodiment, channel region 211 is not immediately contiguous to source and drain regions 208, 210. According to one embodiment of the present invention, trench 212 is between approximately 100 Å and 5000 Å wide and from approximately 100 Å to 5000 Å deep. Preferably, trench 212 has rounded corners at both the top and bottom of the trench, and the angle of the walls of trench 212 is substantially normal to the top surface. Alternatively, the angle of the trench walls may be slightly sloped to diverge upwardly. Trench-to-gate insulating layer 214 is preferably a high dielectric constant (K) material. Preferably, the thickness of trench-to-gate insulating layer 214 is scaled according to the width of trench 212 such that the thickness of trench-to-gate insulating layer 214 does not comprise a significant part of the dimensions of trench 212. Trench-to-gate insulating layer 214 may comprise a uniform thickness on the vertical sidewalls and the bottom surface of trench 212. Alternatively, the thickness of trench-to-gate insulating layer 214 may be thicker on the upright vertical sidewalls inside trench 212 than on the bottom surface inside the trench. Trench-to-gate insulating layer 214 is preferably a nitridized thermal oxide, a deposited high temperature oxide (HTO), or composited dielectric films with a K approximately equal to or greater than 4.0. Other high K films, such as $Ta_2O_5$, may also be used. Moreover, trench-to-gate insulating layer 214 may comprise either one film formed on both the vertical sidewalls and the bottom surface inside trench 212, or it may comprise one type of film formed on the vertical sidewalls inside trench 212 and a different film formed on the bottom surface inside trench 212. Trenched floating gate electrode 216 is formed on trench-to-gate insulating layer 214 inside trench 212 and in a preferred embodiment, has a top surface which is substantially planar to a top surface of substrate 202. Trenched floating gate electrode 216 is a conductive material such as polysilicon preferably doped with n-type material and has a final thickness which is approximately of the same thickness as the depth of trench 212. The inter-gate insulating layer 218 is typically a high K dielectric material and preferably is an Oxide-Nitride-Oxide (ONO) layer formed in conventional manner. Control gate electrode 220 is a conductive material, such as polysilicon, preferably doped with n-type material, or a layer of polysilicide, and is approximately 200–5000 Å thick. Control gate spacers 224 are immediately contiguous to the vertical side surfaces of control gate electrode 220. Control sate spacers 224 are typically formed by first depositing a 100–2000 Å thick layer of oxide and then etching the oxide with a reactive ion etch (RIE). Corner dopings 226 are formed in semiconductor substrate 202 and are immediately contiguous to the upper vertical sides or sidewalls of trench 212 and immediately contiguous to the substrate surface. One factor in determining the depth of corner dopings 226 is the need for electrons to flow from the drain region through the vertical sidewalls of trench 212 and into the trenched floating gate for program and erase operations. Therefore, corner dopings 226 only extend partially along the upper vertical sidewalls of trench 212, and in one embodiment, the depth of corner dopings 226 is approximately less than the one half the depth of the trench. The effective width of corner dopings 226 is determined by the width of control gate spacers 224. The depth of corner dopings 226 may be determined by at least two factors. In one embodiment, the depth of corner dopings 226 is scaled to reduce the capacitance between control gate electrode 220 and source and drain regions 208, 210. In another embodiment, the depth of corner dopings 226 is scaled to reduce the dielectric leakage along the corner of trench 212. Corner dopings 226 are preferably doped with "acceptor" or p-type impurities, such as boron, and may be formed using any one of several conventional methods. Preferably, corner dopings 226 are formed with an implant or implants in conventional manner at an angle of approximately 0–30 degrees, a dose range on the order of approximately $1E13$ atoms cm$^{-2}$ to on the order of $1E15$ atoms cm$^{-2}$, and with an energy between approximately 1 keV to 60 keV. While the present invention has been described in terms of a single device structure, it should be recognized that the underlying structure of the present invention may be coupled to other device structures to form an array for a semiconductor device, such as a memory array.

One advantage of the present invention is the more planar topography of the trenched floating gate device structure when compared to prior art non-volatile device structures. The more planar topography resulting from the reduced stacked gate height improves the process control and manufacturability of devices employing the principles of the present invention. Additionally, the more planar topography of the present invention improves the subsequent process controls, such as contact etch process for forming multilevel interconnects. The corner dopings of the present invention minimize the sensitivity to misalignments between the control gate and the source and drain regions by reducing the capacitance coupling between the control gate and the source and drain regions. The corner dopings also improve isolation by reducing leakages through the corners of the trench in which the trenched floating gate is formed.

Embodiments employing the principles of the present invention also provide low substrate current programming suitable for low power applications. While the operation of the present invention will be described in terms of an n-p-n device, it should be recognized that the operation of a p-n-p device is also possible by biasing the electrodes with an opposite polarity. Each individual device in an array may be selectively programmed one at a time by positively biasing control gate 220, grounding drain region 210, and floating source region 208, p-well junction 204, and substrate 202 which results in an injection of electrons into trenched floating gate 216 through the vertical sidewall of trench 212 adjacent to drain region 210. Because source region 208, p-well junction 204, and substrate 202 are floating, no substrate current is generated during the programming operation. Devices employing the principles of the present invention provide erasure of the entire device at the same time. The device is erased by floating source region 208 and drain region 210 and creating a voltage differential across well junction region 204, trenched floating gate 216, and control gate 220. The voltage differential may be created by grounding control gate 220 and positively biasing p-well junction 204 or the combination of negatively biasing control gate 220 with grounding or less positively biasing p-well junction 204. The device can also be erased by creating a negative voltage differential of the trenched floating gate and the control gate across the gate dielectrics surrounded by the source region, the drain region and the p-well junction region. In this case, the source region and the drain region are not floating. The device is read by biasing source region 208, drain region 210, and control gate 220 so that a complete channel 211 is formed. One preferred way to read the device is to positively bias control gate 220 and drain region 210, and to ground source region 208 and p-well junction 204 or substrate 202.

Figure 3A:
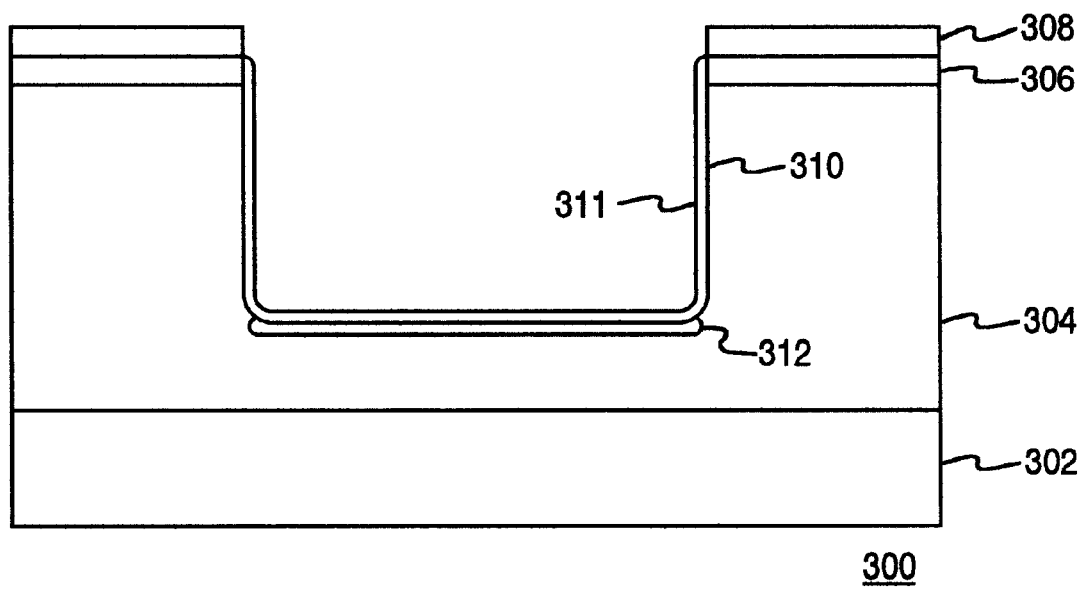
FIGS. 3A–3J are cross-sectional views of a semiconductor substrate in various stages of processing in accordance with the present invention.

FIGS. 3A–3J are cross-sectional views of one embodiment of a semiconductor substrate in various stages of processing in accordance with the present invention. While the present invention will now be described in terms of fabricating a single device structure, it should be recognized that the underlying process of the present invention may be employed to fabricate multiple devices on a single substrate. FIG. 3A is a cross-sectional view of a semiconductor wafer 300 comprising a substrate 302, a well junction region 304, a first pad oxide layer 306, a nitride layer 308, a trench 310, a second pad oxide layer 311 and a channel region 312. Substrate 302 is of a desired semiconductor material, such as an n-doped silicon substrate cut from a single silicon crystal. Well junction region 304 is a diffusion region, preferably p-type, in substrate 302 and is formed in conventional manner using ion implantation and thermal cycle techniques. The depth of well junction region 304 is preferably sufficient to support the program and erase voltages of the device. First pad oxide layer 306 is approximately 100 Å thick and provides stress relief between substrate 302 and nitride layer 308. Nitride layer 308 has a thickness of approximately 1500 Å and preferably comprises silicon nitride ($Si_3N_4$). Nitride layer 308 serves as a masking layer or etch stop for subsequent oxidation, chemical-mechanical polishing (CMP), and reactive ion etching. First pad oxide laser 306 and nitride layer 308 may be deposited in conventional manner by chemical vapor deposition (CVD), or other techniques. Trench 310 is formed in conventional manner using a reactive ion etch (RIE) to remove the silicon substrate. The trench etching process may also include multiple steps such as a nitride etch, an oxide etch and a high selectivity silicon to oxide etch. In one embodiment of the present invention, a second pad oxide layer 311 is formed on substrate 302 in conventional manner by thermal oxidation in a dry oxygen ambient, either with or without chlorine, and is preferably, approximately 100 Å. In a preferred embodiment, channel region 312 is preferably formed using ion implantation of phosphorous in conventional manner with a dose range on the order of approximately 1E10 atoms $cm^{-2}$ to approximately 1E13 atoms $cm^{-2}$ and an energy of approximately 1 keV to 60 keV in order to form a depletion type channel region to achieve a low threshold voltage. Alternatively, channel region 312 may be formed using an ion implantation of boron in conventional manner.

Figure 3B:
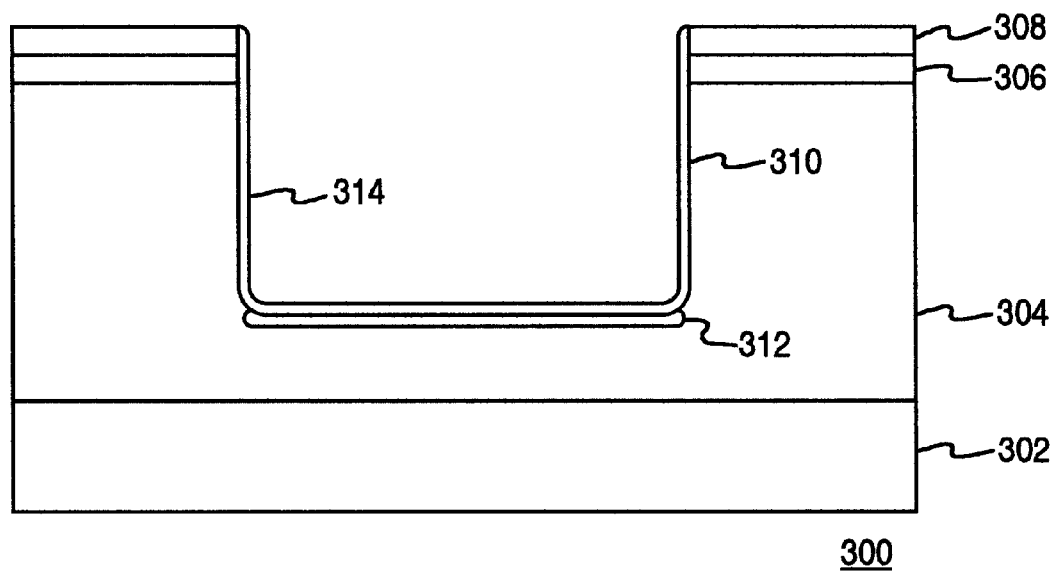

After channel region 312 has been formed, second pad oxide layer 311 is removed in conventional manner by a wet chemical etch, and a trench-to-gate insulating layer is formed in conventional manner in trench 310 to isolate the trenched gate from trench 310. FIG. 3B shows a cross-sectional view of semiconductor wafer 300 following formation of trench-to-gate insulating layer 314. Preferably, a dielectric layer, such as a layer of thermally grown or deposited oxide, preferably nitridized, is formed in conventional manner with a uniform thickness on the upright vertical sidewalls and on the bottom surface in trench 310. Preferably, the nitridized oxide has a dielectric constant (K) higher than about 4.0. Alternatively trench-to-gate insulating layer 314 may be formed such that trench-to-gate insulating layer 314 has a different thickness on the vertical sidewalls inside trench 310 from the thickness on the bottom surface inside trench 310. This allows independent device operation for program and erase or read functions.

Figure 3C:
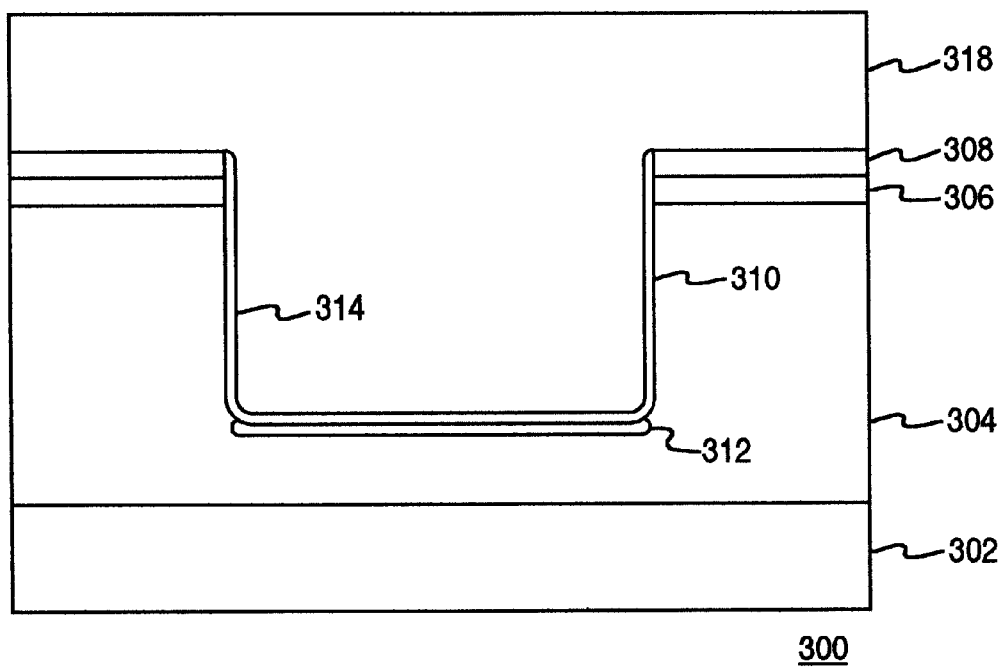

Semiconductor wafer 300 is then deposited with a layer of polysilicon 318 to form the trenched floating gate. FIG. 3C is a cross-sectional view of semiconductor wafer 300 following deposition of a layer of polysilicon 318. The thickness of polysilicon layer 318 is selected according to the depth of trench 310. In a preferred embodiment of the invention, the thickness of polysilicon layer 318 is between about 1000 Å and 10,000 Å. Typically, polysilicon layer 318 may be formed in conventional manner by low pressure chemical vapor deposition (LPCVD) and can be doped in situ in conventional manner.

Figure 3D:
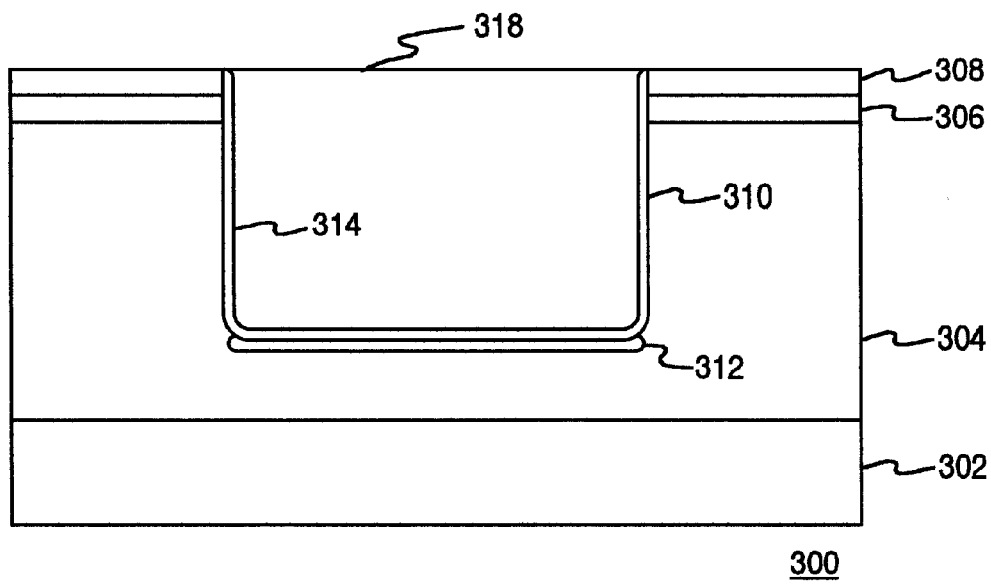
Figure 3E:
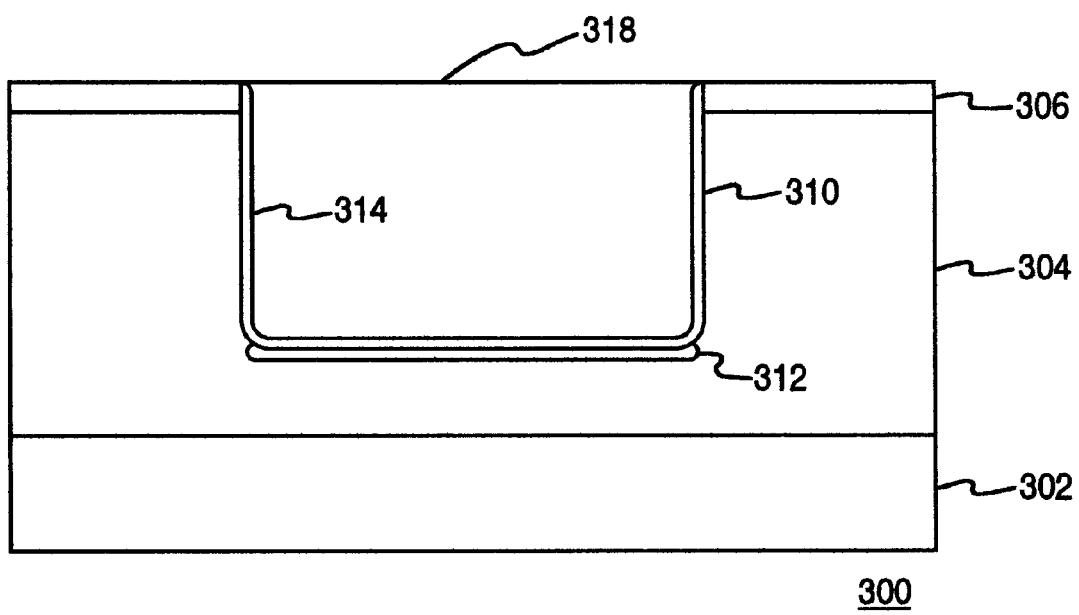

Polysilicon layer 318 is subsequently planarized to remove portions of the polysilicon. FIG. 3D is a cross-sectional view of semiconductor wafer 300 following planarization of polysilicon layer 318. Polysilicon layer 318 is planarized by using conventional techniques such as chemical-mechanical planarization (CMP). During a CMP, nitride layer 308 is used as an etch stop for the planarization process. Nitride layer 308 and a portion of polysilicon layer 318 above the silicon dioxide interface are then removed by a plasma etch as shown in FIG. 3E.

Figure 3F:
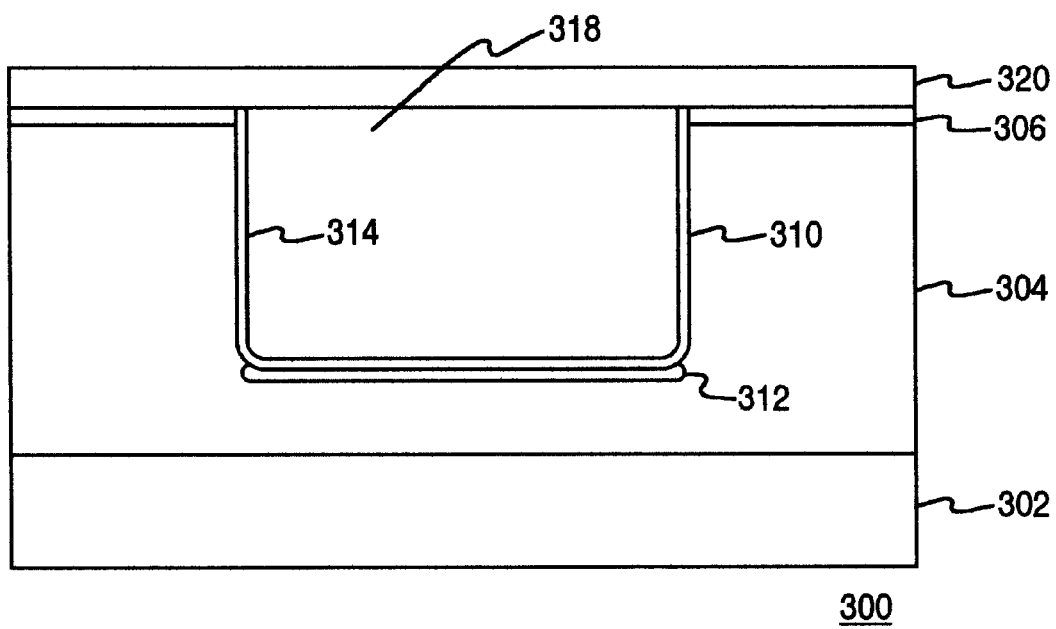
Figure 3G:
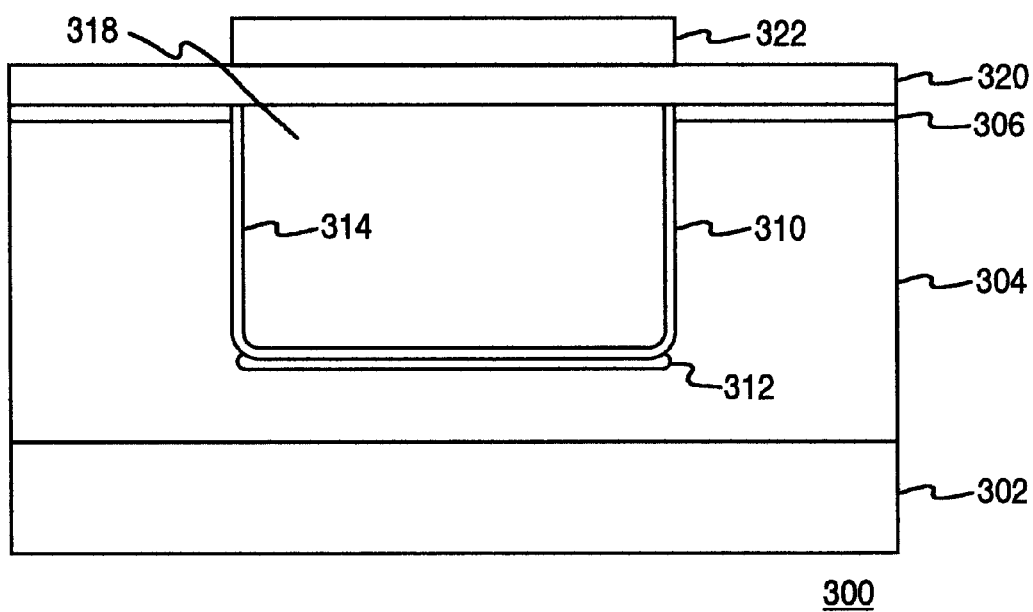

Next, an inter-gate dielectric layer 320 is deposited on the surface of polysilicon layer 318 and pad oxide layer 306. FIG. 3F is a cross-sectional view of semiconductor wafer 300 after forming inter-gate dietlectric 320. The inter-gate dielectric 320 is preferably an Oxide-Nitride-Oxide (ONO) layer formed in conventional manner. After inter-gate dielectric 320 has been formed over substrate 302, a second layer of polysilicon or a layer of polysilicide 322 to form the control gate for non-volatile devices is deposited on the surface of inter-gate dielectric layer 320 and is patterned using conventional photolithographic techniques. Second polysilicon or polysilicide layer 322 is etched in conventional manner using an RIE etch. FIG. 3G is a cross-sectional view of semiconductor wafer 300 after the control gate electrode 322 has been formed. Preferably, the dimensions of the control gate should be slightly larger than the dimension of the trench. Alternatively, the dimensions of the control gate and the trench may be approximately equal such that they are fully aligned. The thickness of second polysilicon or polysilicide layer 322 is selected according to device vertical scaling. In a preferred embodiment of the present invention, the total thickness of second polysilicon or polysilicide layer 322 is between about 200 A and 5000 A. If polysilicon is used, it is preferably insitually doped.

Figure 3H:
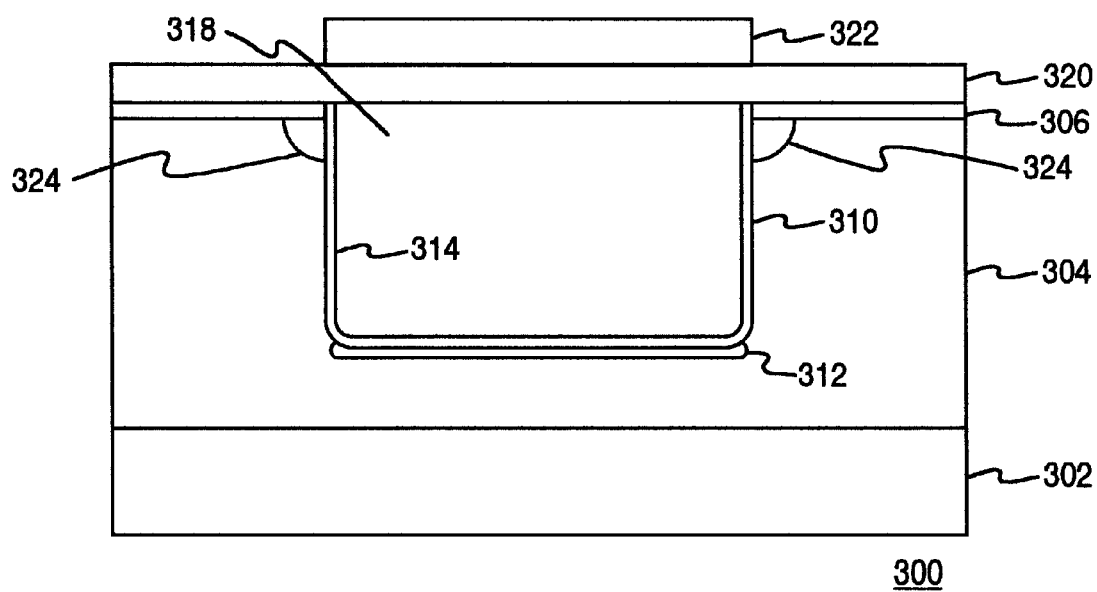

Afterward, substrate 302 is implanted, preferably with p-type dopant impurities, to form corner dopings 324. FIG. 3H is a cross-sectional view of semiconductor wafer 300 following formation of corner dopings 324. The implant or implants are preferably done at an angle of 0–30 degrees, with a dose range on the order of approximately 1E13 atoms $cm^{-2}$ to on the order of 1E15 atoms $cm^{-2}$, and with an energy approximately between 1 keV to 60 keV. Alternatively, other conventional methods for forming corner dopings 324 may be used. The effective width of corner dopings 324 is determined by the width of the control gate spacers 326.

Figure 3I:
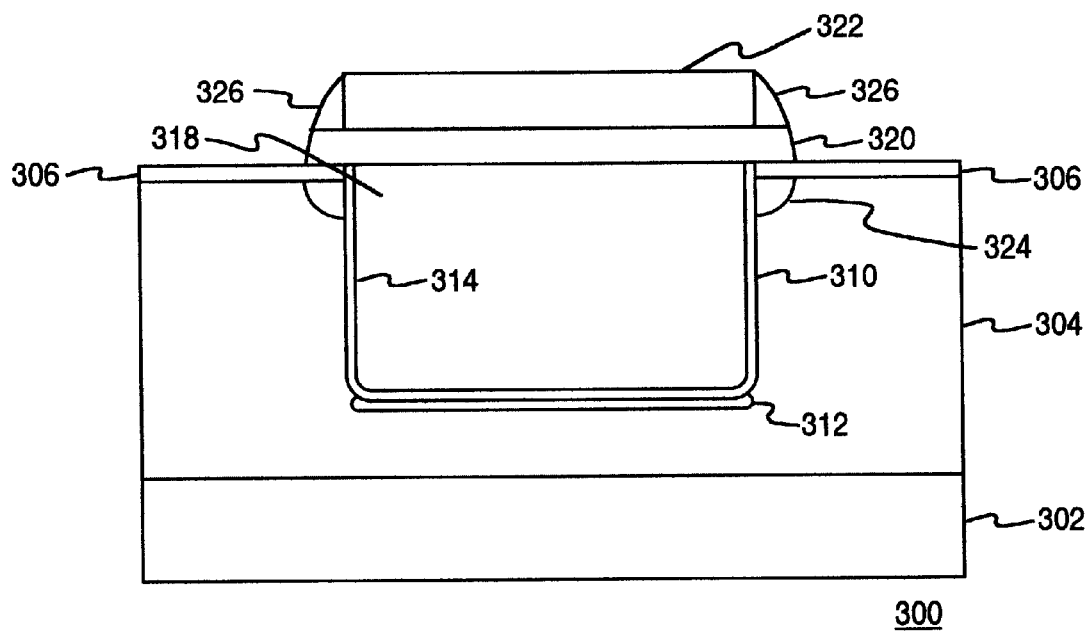

Next, control gate spacers 326 are formed at the upright vertical surfaces of polysilicon layer 322 and on inter-gate dielectric layer 320. FIG. 3I is a cross-sectional view of semiconductor wafer 300 following formation of control gate spacers 326. Control gate spacers 326 are formed by first growing or depositing the spacer oxide in conventional manner over wafer 300 to between 100 and 2000 A thick, and then performing an RIE etch to fabricate the final form of control gate spacers 326. Portions of inter-gate dielectric layer 320 outside the control gate are then removed in conventional manner by a plasma etch. Control gate spacers 326 protect and define corner dopings 324 of structure 300. Control gate spacers 326 also separate control gate electrode 322 from the source and drain junctions for silicidation.

Figure 3J:
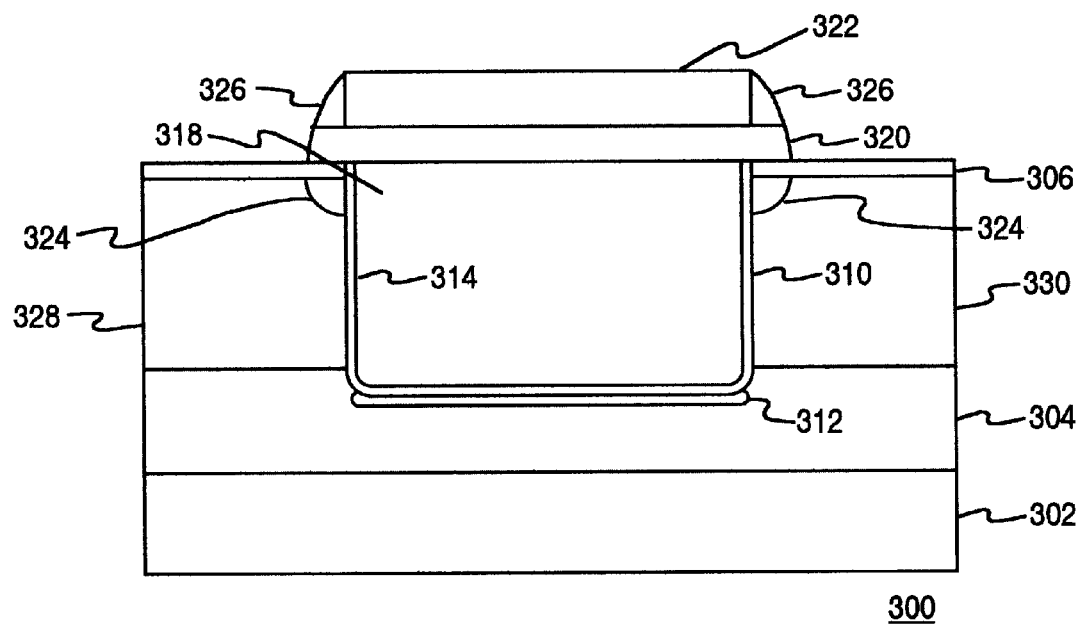

After formation of control gate spacers 326, conventional semiconductor processes are used to form the source and drain regions 328, 330 as shown in FIG. 3J. Preferably, multiple ion implantations of arsenic, phosphorous or a combination of arsenic and phosphorous with a dose range on the order of approximately 1E14 atoms $cm^{-2}$ to approximately 1E16 atoms $cm^{-2}$ are performed at different implant energies. Alternatively, the source and drain implant may be done through the contact openings after the contacts have been formed. The advantage of this alternate embodiment is that a deeper implant can be used to form the source and drain regions through the contact mask without adversely affecting the integrity of the device. Finally, standard MOS processes are used to complete processing of the semiconductor structure.

Figure 4A:
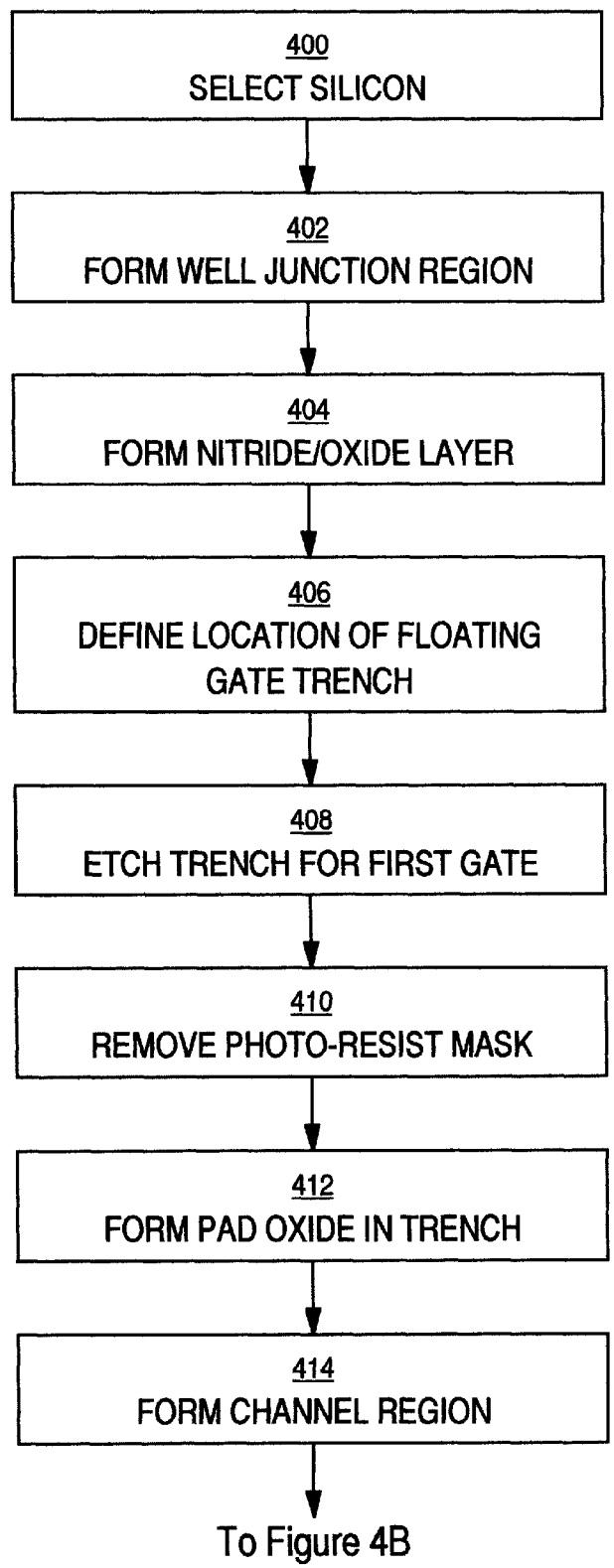
FIGS. 4A, 4B, and 4C comprise a flow chart representing the stages of manufacture according to the illustrated embodiment of FIGS. 3A–3J.
Figure 4B:
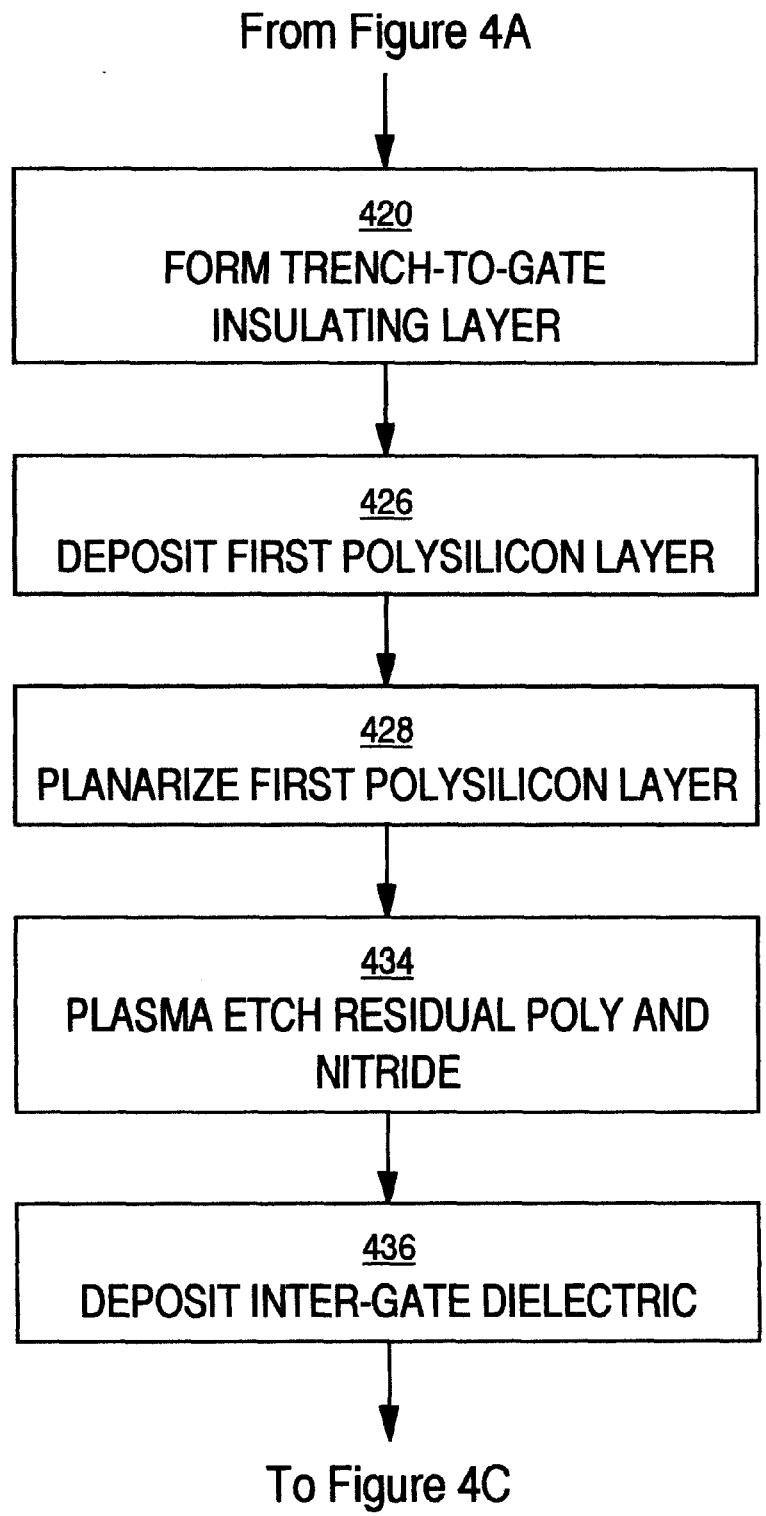
Figure 4C:
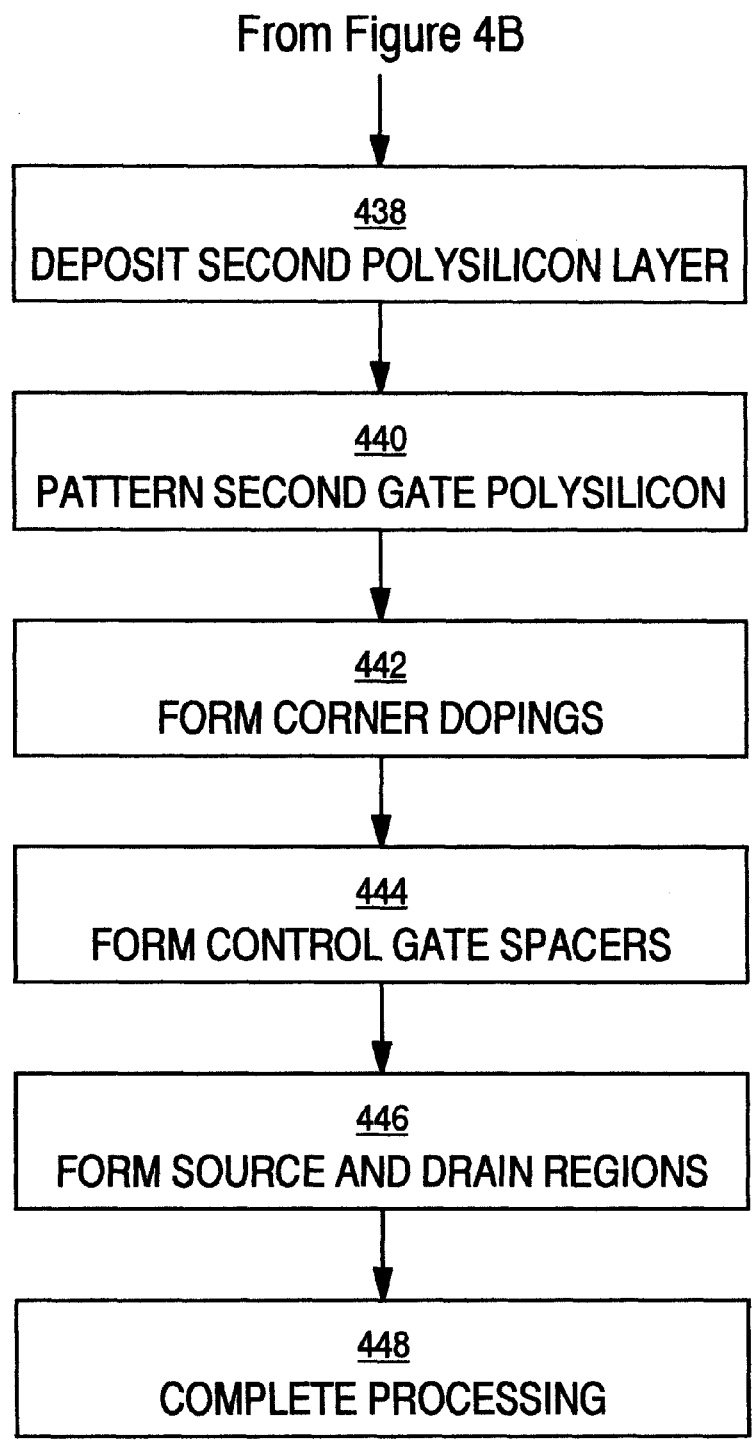

FIGS. 4A, 4B, and 4C comprise a flow chart detailing one embodiment of a method for producing a trenched gate semiconductor device with corner dopings for low power applications in accordance with the present invention. After a desired semiconductor substrate has been selected 400 for processing, a well junction region is formed 402 in the semiconductor substrate. A pad oxide layer and a nitride layer are then formed 404 on the substrate which is subsequently masked with a photo-resist layer to define 406 the location of the floating gate trench. This pad oxide and nitride sandwhich can also be used for trench isolation (not shown) that can be easily integrated with this invention flow. The exposed nitride and oxide layers and the underlying silicon substrate as are then etched 408 to remove the silicon substrate at the selected locations. The photo-resist layer is removed 410 and a pad oxide is formed 412 in the trench. Next, the substrate is implanted with dopant impurities to form 414 the channel region. A trench-to-gate insulating layer is then formed 420 at the vertical sides and on the bottom surface inside the trench. Next, a first polysilicon layer is deposited 426 over the entire substrate to fill the trench. The polysilicon layer is then planarized 428 preferably using a chemical mechanical polish. A selective plasma etch is performed 434 to remove the nitride layer and a portion of the polysilicon layer above the silicon dioxide interface. An inter-gate dielectric layer is then deposited 436 using conventional thermal and CVD techniques. A second layer of polysilicon is then deposited 438 on the substrate and patterned and etched 440 using conventional photolithographic techniques to form the control gate. The substrate is then implanted with dopant impurities of one conductivity type to form 442 corner dopings. Thereafter, control gate spacers are then formed 444 at the vertical surfaces of the control gate and on the inter-gate dielectric layer. Finally, standard processing techniques are used to form the source and drain regions 446 and to complete processing 448 of the device.

What is claimed is:

1. A method for fabricating a semiconductor device having a trenched gate and corner dopings for low power applications comprising:

ion implanting the semiconductor substrate with dopant impurities to form a well junction region in the semiconductor substrate;

etching a trench having substantially upright vertical sidewalls and a bottom surface in the well junction region;

forming a channel region beneath the bottom surface of the trench;

forming a trench-to-gate insulating layer inside the trench;

forming a trenched gate electrode on the trench-to-gate insulating layer inside the trench;

forming an inter-gate dielectric layer on a top surface of the trenched gate electrode;

forming a control gate electrode on a top surface of the inter-gate dielectric layer with substantially upright vertical sides;

implanting the semiconductor substrate to form corner dopings in the substrate immediately contiguous the upper substantially upright vertical sidewalls of the trench and a top surface of the semiconductor substrate; and ion implanting the semiconductor substrate for forming a source region and a drain region in the well junction region of the semiconductor substrate.

2. The method of claim 1 wherein the step of forming a trenched gate electrode further comprises:

depositing a layer of polysilicon on the trench-to-gate insulating layer inside the trench; and planarizing the layer of polysilicon to substantially planar orientation with a top surface of the semiconductor substrate.

3. The method of claim 1 further comprising the step of:

forming control gate spacers at the substantially upright vertical sides of the control gate electrode.

4. The method of claim 1 wherein the step of forming a channel region comprises forming a depletion type channel region.

5. The method of claim 1 wherein the step of forming the source and drain region comprises multiple implants to create source and drain regions with asymmetrical depths.

* * * * *